US009012024B2

(12) United States Patent
Thoumazet et al.

(10) Patent No.: US 9,012,024 B2
(45) Date of Patent: Apr. 21, 2015

(54) BARRIER LAYER TO SIOC ALKALI METALS

(71) Applicant: Saint-Gobain Glass France, Courbevoie (FR)

(72) Inventors: Claire Thoumazet, Paris (FR); Martin Melcher, Herzogenrath (DE); Arnaud Huignard, Compigne (FR); Raphael Lante, Herzogenrath (DE)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 14/358,540

(22) PCT Filed: Nov. 14, 2012

(86) PCT No.: PCT/FR2012/052622
§ 371 (c)(1),
(2) Date: May 15, 2014

(87) PCT Pub. No.: WO2013/072623
PCT Pub. Date: May 23, 2013

(65) Prior Publication Data
US 2014/0349107 A1  Nov. 27, 2014

(30) Foreign Application Priority Data
Nov. 16, 2011  (FR) .................................... 11 60418

(51) Int. Cl.
*B32B 17/06* (2006.01)
*C23C 16/22* (2006.01)
(Continued)

(52) U.S. Cl.
CPC ............ *C03C 17/3441* (2013.01); *C23C 16/401* (2013.01); *C03C 2218/152* (2013.01); *C03C 2218/153* (2013.01); *C03C 2218/156* (2013.01); *C23C 16/325* (2013.01); *C23C 16/402* (2013.01)

(58) Field of Classification Search
USPC ......... 428/426, 428, 432, 688, 689, 699, 701, 428/702, 704; 204/192.1; 427/255.28, 427/255.29, 585, 587, 590
See application file for complete search history.

(56) References Cited

U.S. PATENT DOCUMENTS 5,304,394 A    4/1994  Sauvinet et al.
5,723,172 A *  3/1998  Sherman ...................... 427/109
(Continued)

FOREIGN PATENT DOCUMENTS

EP    0 518 755    12/1992
WO   2011 101572    8/2011

OTHER PUBLICATIONS

Ryan, J. V. et al., "Synthesis and characterization of inorganic silicon oxycarbide glass thin films by reactive rf-magnetron sputtering", Journal of Vacuum Science and Technology, vol. 25, No. 1, pp. 153-159, (Jan. 3, 2007) XP012102547.
(Continued)

*Primary Examiner* — David Sample
*Assistant Examiner* — Lauren Colgan
(74) *Attorney, Agent, or Firm* — Oblon, McClelland, Maier & Neustadt, L.L.P.

(57) ABSTRACT

The invention relates to a glazing comprising a transparent glass substrate containing ions of at least one alkali metal and a transparent layer made of silicon oxycarbide ($SiO_xC_y$) having a total thickness E with (a) a carbon-rich deep zone, extending from a depth $P_3$ to a depth $P_4$, where the C/Si atomic ratio is greater than or equal to 0.5, and (b) a carbon-poor surface zone, extending from a depth $P_1$ to a depth $P_2$, where the C/Si atomic ratio is less than or equal to 0.4, with $P_1<P_2<P_3<P_4$ and $(P_2-P_1)+(P_4-P_3)<E$
the distance between $P_1$ and $P_2$ representing from 10% to 70% of the total thickness E of the silicon oxycarbide layer and the distance between $P_3$ and $P_4$ representing from 10% to 70% of the total thickness E of the silicon oxycarbide layer.

9 Claims, 2 Drawing Sheets

Figure 1:
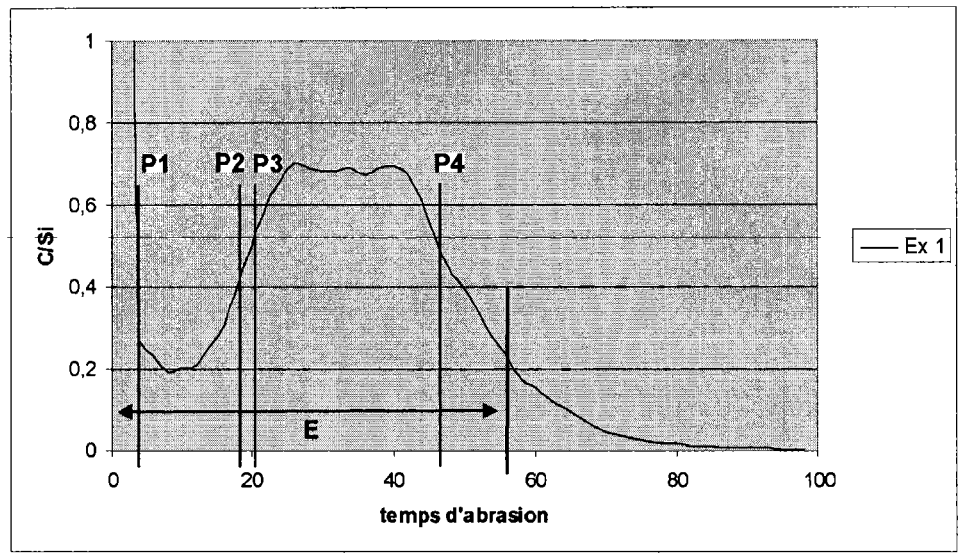

(51) Int. Cl.
*C03C 17/34* (2006.01)
*C23C 16/40* (2006.01)
*C23C 16/32* (2006.01)

(56) References Cited

U.S. PATENT DOCUMENTS

| | | | | |
|---|---|---|---|---|
| 6,103,363 | A * | 8/2000 | Boire et al. | 428/325 |
| 6,114,043 | A * | 9/2000 | Joret | 428/428 |
| 7,208,235 | B2 * | 4/2007 | Otani et al. | 428/704 |
| 7,482,060 | B2 * | 1/2009 | Oudard | 428/428 |
| 2002/0102394 | A1 * | 8/2002 | Macquart et al. | 428/216 |
| 2003/0027000 | A1 * | 2/2003 | Greenberg et al. | 428/432 |
| 2003/0162033 | A1 * | 8/2003 | Johnson et al. | 428/426 |
| 2010/0255225 | A1 * | 10/2010 | Cording et al. | 428/34 |
| 2013/0025672 | A1 * | 1/2013 | Auvray et al. | 136/256 |

OTHER PUBLICATIONS

International Search Report Issued Jan. 16, 2013 in PCT/FR12/052622 Filed Nov. 14, 2012.

* cited by examiner

BARRIER LAYER TO SIOC ALKALI METALS

The present invention relates to a thin silicon-oxycarbide-based transparent layer that forms a barrier to the diffusion of alkali-metal ions. The invention also relates to a process for manufacturing such a layer on a mineral glass substrate.

It is known that the diffusion of alkali-metal ions, in particular of sodium ions, from substrates made of glass (borosilicate glass, soda-lime glass) toward and into thin functional layers such as $TiO_2$-based photocatalytic layers, transparent conductive oxide (TCO) layers or hydrophobic organic layers deteriorates the advantageous properties inherent in these functional layers.

It is also known to interpose, between the substrate made of mineral glass rich in alkali-metal ions and said functional layer to be protected, a thin layer of a mineral oxide as a barrier against the diffusion of alkali-metal ions. Mention may be made, as examples of such oxides, of silica, alumina, zirconia, zinc/tin oxide, titanium oxide and silicon oxycarbide (SiOC). The barrier properties to alkali-metal ions of silicon oxycarbide layers are mentioned, for example, in applications EP 1 708 812, EP 1 686 595 and US 2003/612033.

To the Applicant's knowledge, no study exists at the current time regarding the influence of the carbon content of SiOC layers on the ability to block or capture alkali-metal ions. In the context of its studies that aim to optimize silicon oxycarbide sublayers with a view to their subsequent functionalization by hydrophobic agents, the Applicant observed that the silicon oxycarbide layers richest in carbon had the best barrier properties to alkali-metal ions and were also excellent tie layers for the hydrophobic functional agents.

Increasing the carbon content of the thin silicon oxycarbide layers resulted, however, in the undesirable appearance of a yellow coloration of the glazings. Such a coloration is problematic from an esthetic viewpoint, in particular in the field of motor vehicle glazings and glazings for dwellings. It is an even greater problem in the field of photovoltaic cells, where it significantly reduces energy efficiency by filtering out the blue and green components of visible light.

The present invention is based on the discovery that it was possible to significantly reduce the yellow color of thin carbon-rich sodium oxycarbide layers by depositing directly onto these layers either a thin layer of silica ($SiO_2$) essentially free of carbon or a sodium oxycarbide layer significantly poorer in carbon than the underlying layer.

The present invention therefore relates to a glass substrate containing alkali-metal ions and provided with a first transparent thin carbon-rich silicon oxycarbide layer and with a second transparent thin layer, deposited directly onto the first layer and which is significantly less rich in carbon than the first layer or even essentially free of carbon.

As it is, however, often impossible to determine, in the final product, the boundary between the carbon-rich SiOC layer and the carbon-poor or carbon-free layer, these two layers are defined in the present application as a single layer with a carbon-rich deep zone (corresponding to the first layer mentioned above) and a carbon-poor or carbon-free surface zone (corresponding to the second layer mentioned above).

One subject of the present invention is consequently a glazing comprising a transparent glass substrate containing ions of at least one alkali metal and a transparent layer made of silicon oxycarbide ($SiO_xC_y$) having a total thickness E with a carbon-rich deep zone, extending from a depth $P_3$ to a depth $P_4$, where the C/Si atomic ratio is greater than or equal to 0.5, and a carbon-poor surface zone, extending from a depth $P_1$ to a depth $P_2$, where the C/Si atomic ratio is less than or equal to 0.4, with $P_1 < P_2 < P_3 < P_4$ and $(P_2-P_1)+(P_4-P_3) < E$ the distance between $P_1$ and $P_2$ representing from 10% to 70%, preferably from 15% to 50% and in particular from 25% to 40%, of the total thickness E of the silicon oxycarbide layer ($0.1 \leq (P_2-P_1)/E \leq 0.7$) and the distance between $P_3$ and $P_4$ representing from 10% to 70%, preferably from 25% to 60%, in particular from 35% to 50%, of the total thickness E of the silicon oxycarbide layer ($0.1 \leq (P_4-P_3)/E \leq 0.7$).

The sum of the distance between $P_1$ and $P_2$ and the distance between $P_3$ and $P_4$ is of course always less than the overall thickness E of the silicon oxycarbide layer since there exists, between $P_2$ and $P_3$, a zone where the C/Si ratio is intermediate between 0.4 and 0.5, and, beyond $P_4$, a zone where the C/Si ratio is less than 0.5. Furthermore, the zone nearest the surface, located at a depth of less than $P_1$, generally has an extremely high C/Si ratio due to the presence of $CO_2$ originating from the atmosphere or from organic pollutants absorbed at the surface.

The silicon oxycarbide layer of the glazing of the present invention is a dense non-porous layer having a refractive index between 1.45 and 1.9.

Its total thickness E is preferably between 10 and 200 nm, more preferably between 20 and 100 nm, and in particular between 40 and 70 nm.

The absolute methods that make it possible to determine the value of the total thickness of the silicon oxycarbide layer are X-ray reflectometry and transmission electron microscopy (TEM).

In the appended figures, this total thickness of the $SiO_xC_y$ layer is systematically indicated by an arrow. In these figures, and in particular with a view to determining the ratios ($P_2-P_1$)/E and ($P_4-P_3$)/E, it is determined not by one of the absolute methods mentioned above, but by secondary ionization mass spectroscopy (SIMS), which makes it possible to obtain the variation in the silica ($SiO_2$) content as a function of the analysis time and therefore of the depth of the sample analyzed.

In the present invention, the interface between the substrate and the silicon oxycarbide layer is defined as being the depth where the concentration of silica is exactly intermediate between that of the glass substrate and that at the local minimum in the vicinity of the interface. The determination of this depth, corresponding to the total thickness E of the layer, is illustrated in FIG. 2, which shows the variation in the silica ($SiO_2$) content of the sample from FIG. 1. The silica content of the mineral glass substrate is equal to $SiO_{2S}$ and that corresponding to the local minimum in the vicinity of the interface is equal to $SiO_{2M}$. The interface between the glass substrate and the layer deposited by CVD is defined as being located at the depth where the silica content ($SiO_{2intermediate}$) is equidistant between $SiO_{2S}$ and $SiO_{2M}$. This depth E corresponding to $SiO_{2intermediate}$ has been reported on FIG. 1.

The carbon content of the silicon oxycarbide layer is also determined by SIMS. It is expressed in the present application by means of the ratio of the number of carbon atoms to the number of silicon atoms (C/Si atomic ratio).

Figure 2:
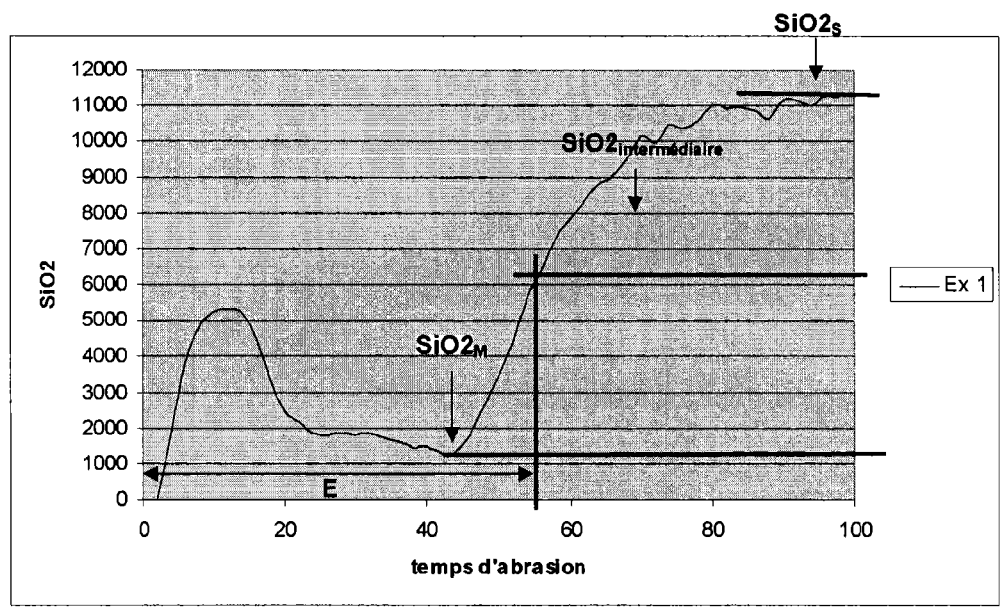

FIG. 1 shows, by way of example, the C/Si ratio as a function of the abrasion time (during the SIMS analysis) of a sample according to the invention. As is known, the abrasion time (indicated on the x axis) is proportional to the depth analyzed, the proportionality factor depending on the experimental conditions and on the nature and properties of the sample. It is observed on this figure that the C/Si ratio is very high at the surface due to possible carbon-containing pollutants and/or adsorbed $CO_2$ originating from the atmosphere. In the layers near the surface, between $P_1$ and $P_2$, it is relatively low (of the order of 0.2) and then increases with the depth to exceed the value of 0.4 at a depth $P_2$, and the value of 0.5 starting from a depth $P_3$. It remains above this value until a depth $P_4$ and then tends toward zero upon arriving at the glass substrate.

As already explained in the introduction, the present invention is based on the discovery that the yellow color of thin carbon-rich silicon oxycarbide layers may be attenuated, or even eliminated, by depositing a thin carbon-poor layer of silica or of silicon.

In the present application, this yellow color is quantified, as is known, using the CIE L*A*b* (hereinafter CIELab) colorimetric system from measurements made on the glazing, after deposition of the layers. The CIELab system defines a color space in the form of a sphere with an axis L* characterizing the lightness, a red/green axis a* and a blue/yellow axis b*. An a* value of greater than 0 corresponds to colors with a red component, a negative a* value to colors with a green component, a positive b* value to colors with a yellow component and a negative b* value to colors with a blue component.

Generally, gray-colored or colorless layers that have low a* and b* values, that is to say values close to zero, will be sought.

The glazings of the present invention preferably have a b* value (CIELab, illuminant D65) between −2 and +3, in particular between −1.5 and +2.0; and an a* value (CIEBab, illuminant D65) between −2 and +2, in particular between −1.5 and +1.5. These values apply to glazings with layers deposited on a transparent colorless substrate made of clear float glass sold by the company Saint-Gobain Glass France under the trade name SGG Planilux®.

Another subject of the present invention is a process for manufacturing the glazings described above.

This process essentially comprises the following two successive steps:

(a) a first step of chemical vapor deposition (CVD) of a carbon-rich silicon oxycarbide layer onto at least one part of the surface of a mineral glass substrate, by bringing said surface into contact with a gas flow containing ethylene ($C_2H_4$), silane ($SiH_4$), carbon dioxide ($CO_2$) and nitrogen ($N_2$), at a temperature between 600° C. and 680° C., the ethylene/silane ($C_2H_4/SiH_4$) volume ratio during step (a) being less than or equal to 3.3, (b1) a second step of chemical vapor deposition (CVD) of a carbon-poor silicon oxycarbide layer onto the carbon-rich layer obtained in step (a), with a gas flow containing ethylene ($C_2H_4$), silane ($SiH_4$), carbon dioxide ($CO_2$) and nitrogen ($N_2$), at a temperature between 600° C. and 680° C., the ethylene/silane ($C_2H_4/SiH_4$) volume ratio during step (b1) being less than or equal to 3.4, or (b2) a second step of depositing a layer of silica ($SiO_2$) by CVD, PECVD or magnetron sputtering onto the carbon-rich layer obtained in step (a).

The first step (step (a)) is preferably carried out on float glass inside the furnace on a tin bath or immediately after exit from the furnace. One particularly advantageous embodiment consists in carrying out the deposition by CVD inside the furnace, where it is relatively easy to create a confined atmosphere essential to a satisfactory control of the chemical composition of the reactive mixture and of the layer deposited.

The deposition temperatures indicated above are the temperatures of the tin bath measured in the immediate vicinity (less than 20 cm away) of the nozzle through which the reactive gases arrive.

When the two layers (steps (a) and (b1)) are deposited by CVD, two nozzles are placed parallel to one another, at a distance generally between 2 and 5 m, the one upstream in the direction of travel of the ribbon forming the deepest layer/zone and the one downstream forming the least deep layer/zone.

Each of the nozzles preferably covers the entire width of the glass ribbon.

It is important to note that, although the process comprises two steps of forming a silicon oxycarbide layer, these "layers" are impossible to distinguish from one another in the final product, where they correspond to carbon-rich and carbon-poor zones of the single silicon oxycarbide layer.

The deposition of thin silicon oxycarbide layers by CVD is known and a person skilled in the art will know how to adjust the flow rates of the reactive gases as a function of the speed of travel of the glass, the furnace temperatures, and the thickness of the layers that it is desired to obtain. In the present invention, the experimental conditions of step (a) and optionally (b1) are preferably adjusted such that the thickness of the $SiO_xC_y$ layer deposited is, after step (b1), between 10 and 200 nm, in particular between 20 and 100 nm and particularly preferably between 40 and 70 nm. These total thickness ranges are also preferred when a layer of silica is deposited below the carbon-rich $SiO_xC_y$ zone by a method other than CVD.

The ethylene/silane ($C_2H_4/SiH_4$) volume ratio during step (a) is preferably between 1 and 3.3, in particular between 1.5 and 3.3. The ratio of oxidizing gas ($CO_2$) to silane ($SiH_4$) is generally between 1 and 50, preferably between 1.5 and 10 and in particular between 2 and 6.

For the deposition of the carbon-poor silicon oxycarbide layer (step (b1)), the ethylene/silane ($C_2H_4/SiH_4$) volume ratio is preferably between 3.5 and 6, in particular between 3.7 and 5.5.

The CVD of the silica layer (step (b2)) is conventionally carried out using tetraethoxysilane as precursor.

The process for manufacturing the glazings of the present invention preferably also comprises, after step (b1) or (b2), a third step (step (c)) of annealing and/or forming the substrate bearing the silicon oxycarbide layer. During this step (c), the substrate is brought to a temperature between 580° C. and 700° C., preferably between 600° C. and 680° C.

EXAMPLES

A glazing according to the invention is prepared by CVD ($C_2H_2$, $SiH_4$, $CO_2$, $N_2$) with two parallel CVD nozzles having a width of 3.3 m each, onto a substrate made of clear float glass (Planilux®) respectively at a temperature of 648° C. and 638° C. (temperature of the tin bath in the immediate vicinity of the nozzle); the width of the ribbon is 3.6 m, its thickness is 2.5 mm and its speed of travel is 15 m/min. The two nozzles are inside the glass-making furnace, at a distance of 3 m from one another.

The first, upstream nozzle delivers the following mixture of reactive gases:

$SiH_4$: 14 nL/min, $CO_2$: 30 nL/min, $C_2H_4$: 39 nL/min (in diluent $N_2$) ($C_2H_4/SiH_4$ volume ratio=2.79).

The second nozzle, downstream of the first, delivers the following mixture of reactive gases:

$SiH_4$: 14 nL/min, $CO_2$: 30 nL/min, $C_2H_4$: 52 nL/min (in diluent $N_2$) ($C_2H_4/SiH_4$ volume ratio=3.71).

Comparative glazing is manufactured under the same experimental conditions. This comparative example differs from the example according to the invention simply by the fact that the second nozzle delivers a mixture of gases identical to that of the second nozzle, namely the following mixture:

$SiH_4$: 14 nL/min, $CO_2$: 30 nL/min, $C_2H_4$: 39 nL/min (in diluent $N_2$) ($C_2H_4/SiH_4$ volume ratio=2.79).

All of the glazings are subjected to an annealing step at a temperature of 640° C. for 8 minutes.

FIG. 1 shows the SIMS spectrum of the glazing according to the invention where the $(P_2-P_1)/E$ ratio is equal to around 29% and the $(P_4-P_3)/E$ ratio is equal to around 46%.

Figure 3:
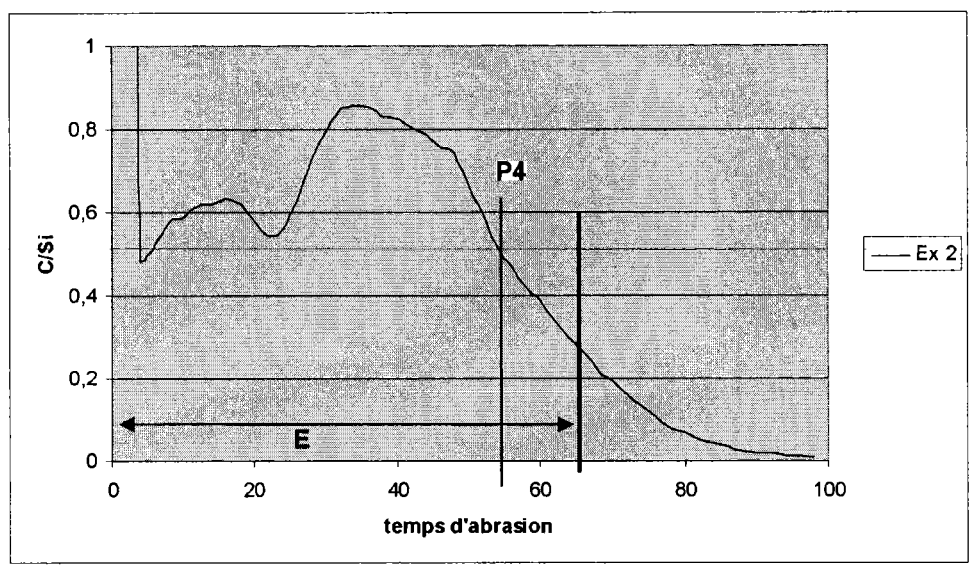

FIG. 3 shows the SIMS spectrum of the comparative example. The silicon oxycarbide layer of this sample has a high carbon content (C/Si>0.4) both in the surface zone and in the deeper zone. It is impossible to determine the values of $P_1$, $P_2$ and $P_3$.

Table 1 presents the values of the parameters a* and b* (CIELab) for the glazings obtained according to the example and the comparative example.

It may be observed that the sample of the comparative example lacking a carbon-free or carbon-poor surface layer has a quite significant yellow color (b*=3.52). This value is significantly reduced for the example according to the invention (b*=1.39) owing to the presence of the carbon-poor layer of the example according to the invention.

TABLE 1

|  | Example according to the invention | Comparative example |
| --- | --- | --- |
| Light transmission | 82.08% | 78.57% |
| a* | −0.95 | −1.09 |
| b* | 1.39 | 3.52 |
| Total thickness determined by TEM | 60.8 nm | 54 nm |

The invention claimed is:

1. A glazing, comprising:
   a transparent glass substrate comprising ions of an alkali metal, and
   a transparent silicon oxycarbide layer ($SiO_xC_y$), having a total thickness E, comprising a carbon-rich deep zone, extending from a depth $P_3$ to a depth $P_4$, with a C/Si atomic ratio of greater than or equal to 0.5, and a carbon-poor surface zone, extending from a depth $P_1$ to a depth $P_2$, with a C/Si atomic ratio of less than or equal to 0.4, wherein $P_1<P_2<P_3<P_4$, $(P_2-P_1)+(P_4-P_3)<E$, a distance between $P_1$ and $P_2$ is from 10% to 70% of the total thickness E of the silicon oxycarbide layer, and
   a distance between $P_3$ and $P_4$ is from 10% to 70% of the total thickness E of the silicon oxycarbide layer.

2. The glazing of claim 1, wherein the total thickness E of the silicon oxycarbide layer is between 10 and 200 nm.

3. The glazing of claim 1, wherein the transparent silicon oxycarbide layer is a non-porous layer having a refractive index between 1.45 and 1.9.

4. The glazing of claim 1, having a b* (CIELab) value between −2 and +3.

5. The glazing of claim 1, wherein the total thickness E of the silicon oxycarbide layer is between 20 and 100 nm.

6. The glazing of claim 1, having a b* (CIELab) value between −1.5 and +2.0.

7. A process for manufacturing the glazing of claim 1, the process comprising:
   first depositing, by chemical vapor deposition (CVD), a carbon-rich silicon oxycarbide layer onto at least one part of a surface of a mineral glass substrate, by contacting the surface with a gas flow comprising ethylene ($C_2H_4$), silane ($SiH_4$), carbon dioxide ($CO_2$), and nitrogen ($N_2$) with an ethylene/silane ($C_2H_4/SiH_4$) volume ratio of less than or equal to 3.3, at a temperature between 600° C. and 680° C.,
   second, either
   depositing, by CVD, a carbon-poor silicon oxycarbide layer onto the carbon-rich silicon oxycarbide layer with a gas flow comprising ethylene ($C_2H_4$), silane ($SiH_4$), carbon dioxide ($CO_2$), and nitrogen ($N_2$) with an ethylene/silane ($C_2H_4/SiH_4$) volume ratio of less than or equal to 3.4, at a temperature between 600° C. and 680° C., or
   depositing a layer of silica ($SiO_2$) by CVD, plasma-enhanced CVD (PECVD), or magnetron sputtering onto the carbon-rich silicon oxycarbide layer.

8. The process of claim 7, further comprising annealing and/or forming at a temperature between 580° C. and 700° C.

9. The process of claim 7, further comprising annealing and/or forming at a temperature between 600° C. and 680° C.

* * * * *